United States Patent [19]

Ludvigsen

[11] Patent Number: 5,687,241
[45] Date of Patent: Nov. 11, 1997

[54] CIRCUIT ARRANGEMENT FOR AUTOMATIC GAIN CONTROL OF HEARING AIDS

[75] Inventor: Carl Ludvigsen, Valby, Denmark

[73] Assignee: Topholm & Westermann APS, Vaerloese, Denmark

[21] Appl. No.: 624,535

[22] PCT Filed: Aug. 2, 1994

[86] PCT No.: PCT/EP94/02560

§ 371 Date: Apr. 12, 1996

§ 102(e) Date: Apr. 12, 1996

[87] PCT Pub. No.: WO95/15668

PCT Pub. Date: Jun. 8, 1995

[30] Foreign Application Priority Data

Dec. 1, 1993 [DE] Germany ............... 43 40 817.6

[51] Int. Cl.$^6$ ............................................. H04R 25/00
[52] U.S. Cl. .......................... 381/68.4; 381/68.2
[58] Field of Search ...................... 381/68.4, 68.2, 381/68, 98, 103, 107, 101, 102, 106

[56] References Cited

U.S. PATENT DOCUMENTS

| | | | |
|---|---|---|---|
| 4,204,260 | 5/1980 | Nysen. | |
| 4,718,099 | 1/1988 | Hotvet. | |
| 4,790,019 | 12/1988 | Hueber. | |
| 4,852,175 | 7/1989 | Kates. | |
| 4,868,880 | 9/1989 | Bennett, Jr.. | |
| 4,887,299 | 12/1989 | Cummins et al.. | |
| 4,947,432 | 8/1990 | Topholm | 381/68.4 |
| 4,996,712 | 2/1991 | Laurence et al. | 381/107 |
| 5,077,800 | 12/1991 | Dupret | 381/68.2 |
| 5,144,675 | 9/1992 | Killion et al. | 381/68.4 |
| 5,165,017 | 11/1992 | Eddington et al. | 381/68.4 |
| 5,210,803 | 5/1993 | Martin et al. | 381/68 |
| 5,278,912 | 1/1994 | Waldhauer | 381/68.4 |

Primary Examiner—Curtis Kuntz
Assistant Examiner—Vivian Chang
Attorney, Agent, or Firm—Sughrue,Mion,Zinn,Macpeak & Seas, PLLC

[57] ABSTRACT

A circuit arrangement for a preferably programmable hearing aid with at least one microphone, at least one electronic signal processing circuit (3), with at least one channel and one output transducer (7), in which the electronic signal processing circuit (3) contains a control circuit for continuous determination or calculation of a percentile value or several percentile values of the input signal from a continuous analysis and evaluation of the frequency and/or amplitude distribution of the input signal, whereby these percentile values serve either directly or indirectly as control signals for controlling the gain and/or frequency response of the electronic signal processing circuit, whereby these percentile values serve directly or indirectly as control signals for closed-loop control of the gain and/or frequency response of the electronic signal processing circuit, whereby at least one percentile estimator (10) is connected on the input side, the percentile estimator consisting of an integrator (11) and a first control stage (12) for up-counting connected with the integrator and a second control stage (13) for down-counting connected with the integrator and of a comparator stage (14) with at least two inputs, whereby the input of the circuit is connected directly or indirectly with one input of the comparator stage (14), a second input of the comparator stage being connected with the output of the integrator (11) and directly or indirectly with the signal processing circuit (3) via a combination and control logic (15) and via at least one control line, the two outputs of the comparator stage (14) being connected with the control stage (12) or control stage (13).

34 Claims, 6 Drawing Sheets

CIRCUIT ARRANGEMENT FOR AUTOMATIC GAIN CONTROL OF HEARING AIDS

BACKGROUND OF THE INVENTION

The invention relates to a circuit arrangement for automatic control of the gain and/or frequency response of the transmission characteristic of an open-loop-controllable and closed-loop-controllable signal processing circuit of a hearing aid.

Severely deaf persons or persons suffering from impaired hearing typically possess a raised hearing threshold, while the influence on the upper threshold, the so-called pain threshold, is significantly less pronounced. For this reason, the dynamic range of the hearing-impaired individual is often significantly reduced compared with normal hearing perception. A certain difficulty arises immediately if it is attempted to counteract this impediment by means of a hearing aid. If linear gain is applied, the restricted dynamic range of the hearing perception of a hearing-impaired individual unavoidably results in amplified signals that conflict with the restricted dynamic range of the person using the hearing aid in certain cases, i.e. for certain combinations of speech and background noise. On the other hand, clinical tests on the use of hearing aids in a noisy environment and in a quiet environment have shown that linear gain with well-matched frequency-dependent gain is clearly superior to every system with automatic gain control for single-channel or multi-channel devices with respect to speech comprehension.

Various devices are already known which allow adaptation of the output signal of a hearing aid to the reduced hearing ability of a hearing-impaired individual. This is the case both for single-channel and for multi-channel hearing aids with automatic control.

In a hearing aid with single-channel gain control, the gain is the parameter of the hearing aid that has to be controlled. The temporal characteristic of this control process is of very great significance as regards the quality of the processed signal. Normally, the time characteristic and temporal behavior of a circuit for automatic gain control are determined by the response time and release time. Typically, response times of a few milliseconds and release times of a few hundred milliseconds are considered optimum for hearing aids. However, operation of a conventional automatic gain control circuit is clearly audible even with these response and release times, and this may possibly have a detrimental effect on speech comprehension and hearing comfort. In order to avoid this, a number of different and somewhat complex circuits for automatic gain control have already been described. Such a system with two different release times is described in U.S. Pat. No. 4,718,099. A further such system uses two input circuits for automatic gain control, namely a quick-action circuit and a slow-action circuit. Both of these systems are less sensitive to loud pulse-type disturbances compared with conventional automatic gain control systems, and both can be called parametric control systems.

Multi-channel technology offers the possibility of independent gain control in a number of channels, thereby permitting control of the output spectrum in greater detail. If such an automatic control facility were thus to be provided in each channel, the relatively stationary response of the automatic control facility would affect the overall frequency response of the hearing aid, since said frequency response is determined by the gain in the respective channels.

A further method is described in U.S. Pat. No. 4,852,175 which utilizes the amplitude distribution in a large number of channels or frequency bands to adjust the frequency response of a multi-channel hearing aid. For this purpose, the complete histogram is calculated and stored for each channel and the gain is then controlled in each channel such that any masking extending into a higher channel does not impair the information in the higher channels.

If, however, non-parametric control is used instead of parametric control, it is possible to obtain a different time characteristic, and this characteristic appears considerably more suited for the type of control and must therefore be preferred as regards quality.

This control method even seems less sensitive to strong pulse-type signals and other relatively fast changes in the signal amplitude than the parametric methods.

SUMMARY OF THE INVENTION

The invention now specifies a circuit arrangement which permits achievement of such a considerable improvement in the automatic control of hearing aids.

BRIEF DESCRIPTION OF THE DRAWING

The invention will now be described in detail on the basis of example embodiments in conjunction with the enclosed drawings.

In the drawings.

DETAILED DESCRIPTION OF THE INVENTION

Figure 1:
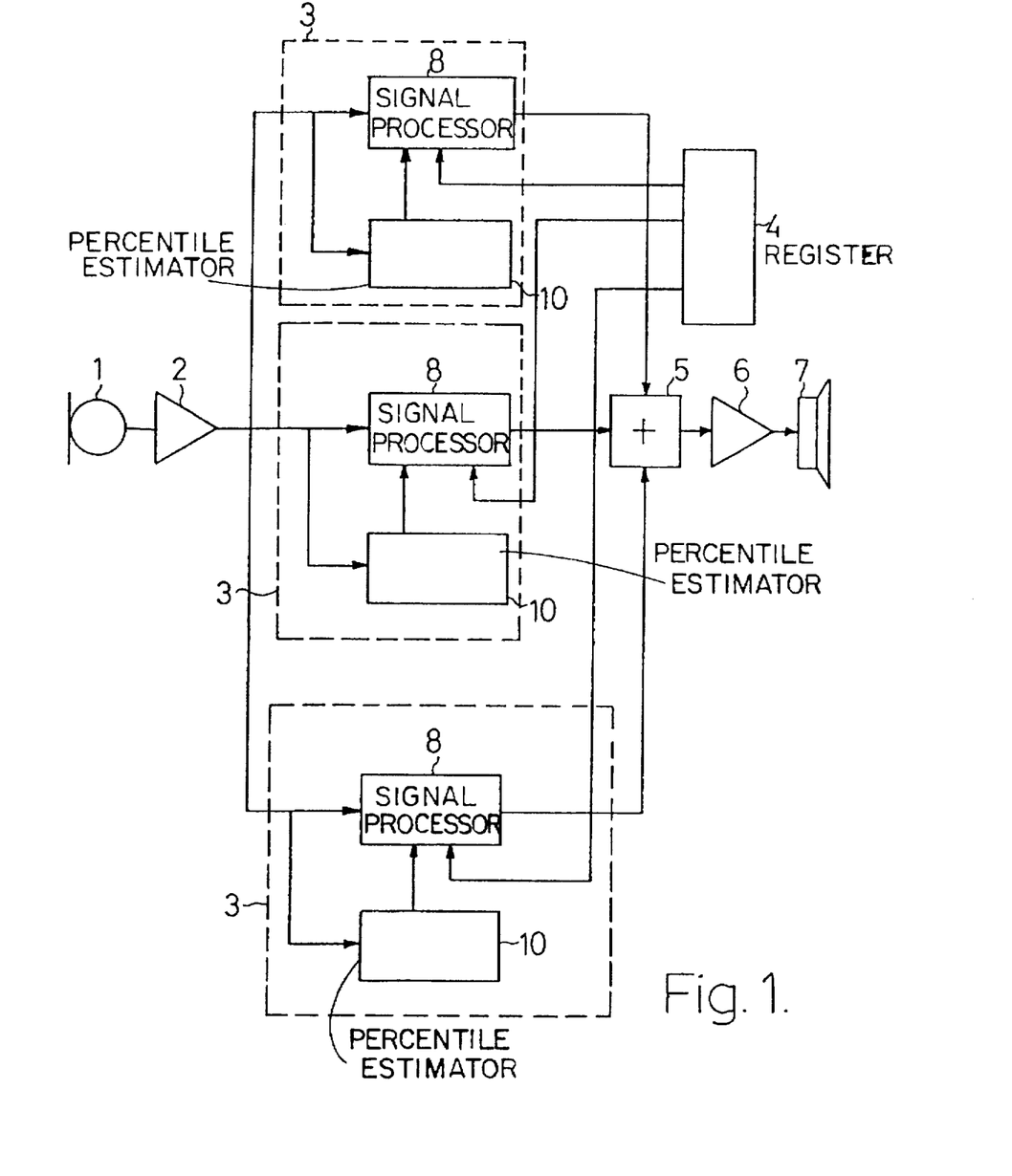
FIG. 1 shows a schematic diagram of a multi-channel hearing aid in accordance with the invention.

FIG. 1 shows a hearing aid in multi-channel design in accordance with the invention. A single-channel version is naturally also possible.

This hearing aid initially consists in the conventional manner of at least one microphone 1 with preamplifier 2, at least one channel, whereby the shown embodiment comprises three channels, each of said channels being provided with an electronically closed-loop-controllable or open-loop-controllable signal processing circuit 3 with a special register 4. This register may be either a memory register for storing control parameters for the hearing loss of the wearer in the normal everyday environment determined by means of the audiogram, or may be a receiver section with demodulator and memory/register for storing program data/information or control parameters for the basic setting of the hearing aid and/or for adjustment of the transmission characteristic of the hearing aid corresponding to the hearing impairment of the wearer and to different environmental situations.

Allocation of the input signal to the individual channels, for example, is performed by means of a number of bandpass filters, which are not shown for the sake of simplicity. In addition, a summation circuit 5, an output amplifier 6 and an output transducer 7 are provided.

The electronic signal processing circuit 3 contains at least one electronic signal processor 8, where appropriate a detector stage 9, as will be explained below in conjunction with FIG. 2, and at least one percentile estimator 10. Such percentile estimators are known in principle from U.S. Pat. No. 4,204,260.

Figure 2:
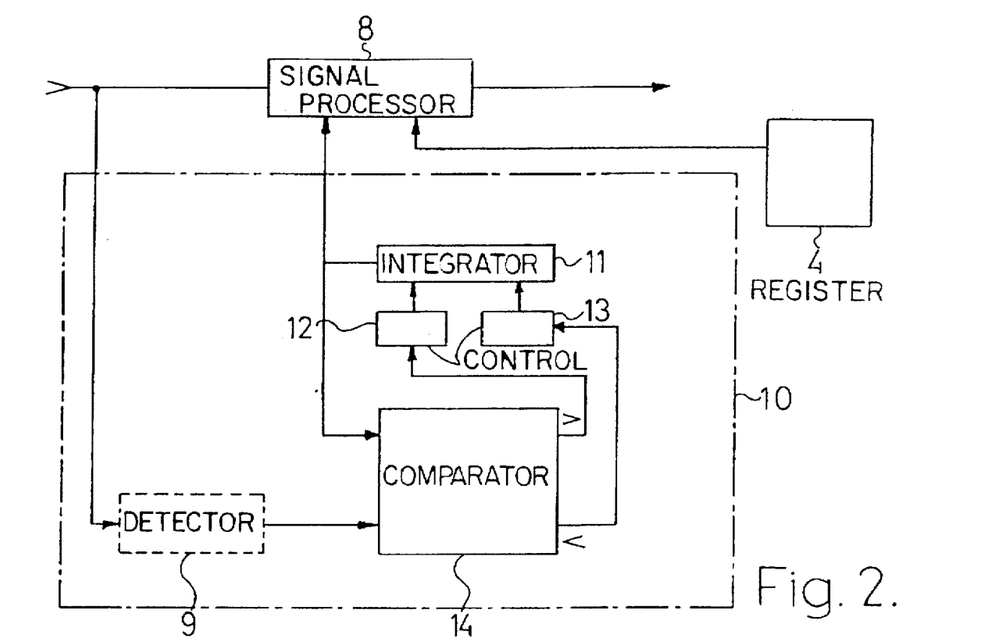
FIG. 2 shows a purely schematic diagram of a first embodiment of a control circuit in accordance with the invention for one channel of a hearing aid.

FIG. 2 shows the design of such a circuit. In its analog embodiment, which is to be considered equivalently alongside a digital embodiment described below, the percentile estimator 10 consists of an integrator 11, for example a capacitive store and two control stages 12 and 13, as well as of an analog comparator circuit 14. The detector stage 9 could be omitted in principle, but will be preferably used.

The input signal arriving from the input of the circuit is continuously rectified in the detector stage 9, e.g. a rectifier circuit, in order to determine the envelope of the input signal. It is equally possible to perform a logarithmic transformation at this point instead. The signal obtained as a result is supplied to an input of the comparator stage 14. The voltage stored in the integrator 11 is present at the other input. If the voltage amplitude derived from the input signal is greater than the voltage stored in the integrator, a negative control pulse is output to the control stage 13, which then reduces the voltage stored in the integrator 11 by a predefined voltage value. If the input voltage amplitude is lower than the voltage stored in the integrator 11, however, a positive control pulse is output to the control stage 12 which increases the voltage in the integrator 11 by an also predefined amount. The control stages 12 and 13 may be potentiometers or controllable resistors, for example. The voltage present in the integrator 11 then represents, in highly simplified form, the control signal for the electronic signal processor 8. At this juncture, it must be pointed out that the amounts or coefficients by which the voltage of the integrator 11 is changed by the control stages 12 or 13 after every comparison are preferably not identical. This will be explained in detail below. However, it must be mentioned that these step values are either fixed or adjustable and may even be programmable.

Figure 3:
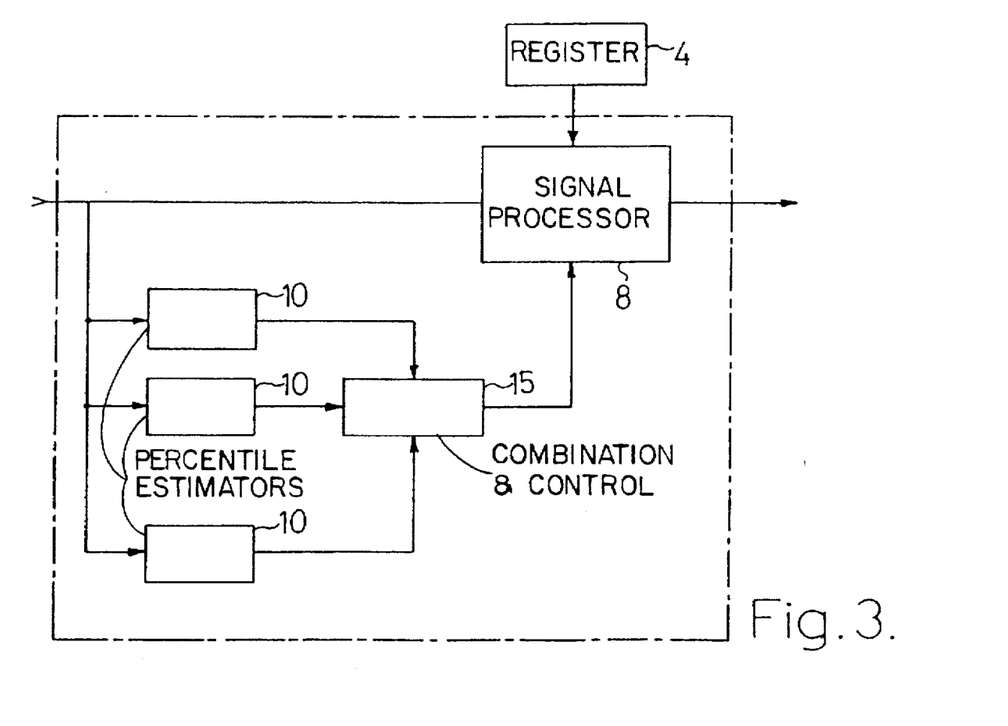
FIG. 3 shows a purely schematic diagram of a farther embodiment of the control circuit shown in FIG. 2.

FIG. 3 schematically shows a channel of a single-channel or multi-channel hearing aid which is provided with an electronic signal processor 8 and three percentile estimators 10 whose output signals are combined in a combination and control logic 15 for percentile values of 10%, 50% and 90%, for example, and is then combined into one control signal or several control signals by means of a predefined, where appropriate also programmable, mathematical operation. In the latter case, the combination and control logic 15 may naturally be designed so that separate open-loop and closed-loop control signals are supplied via corresponding connections for different stages of the electronic signal processor 8. Everything that was explained for FIG. 2 is valid here also.

Figure 4:
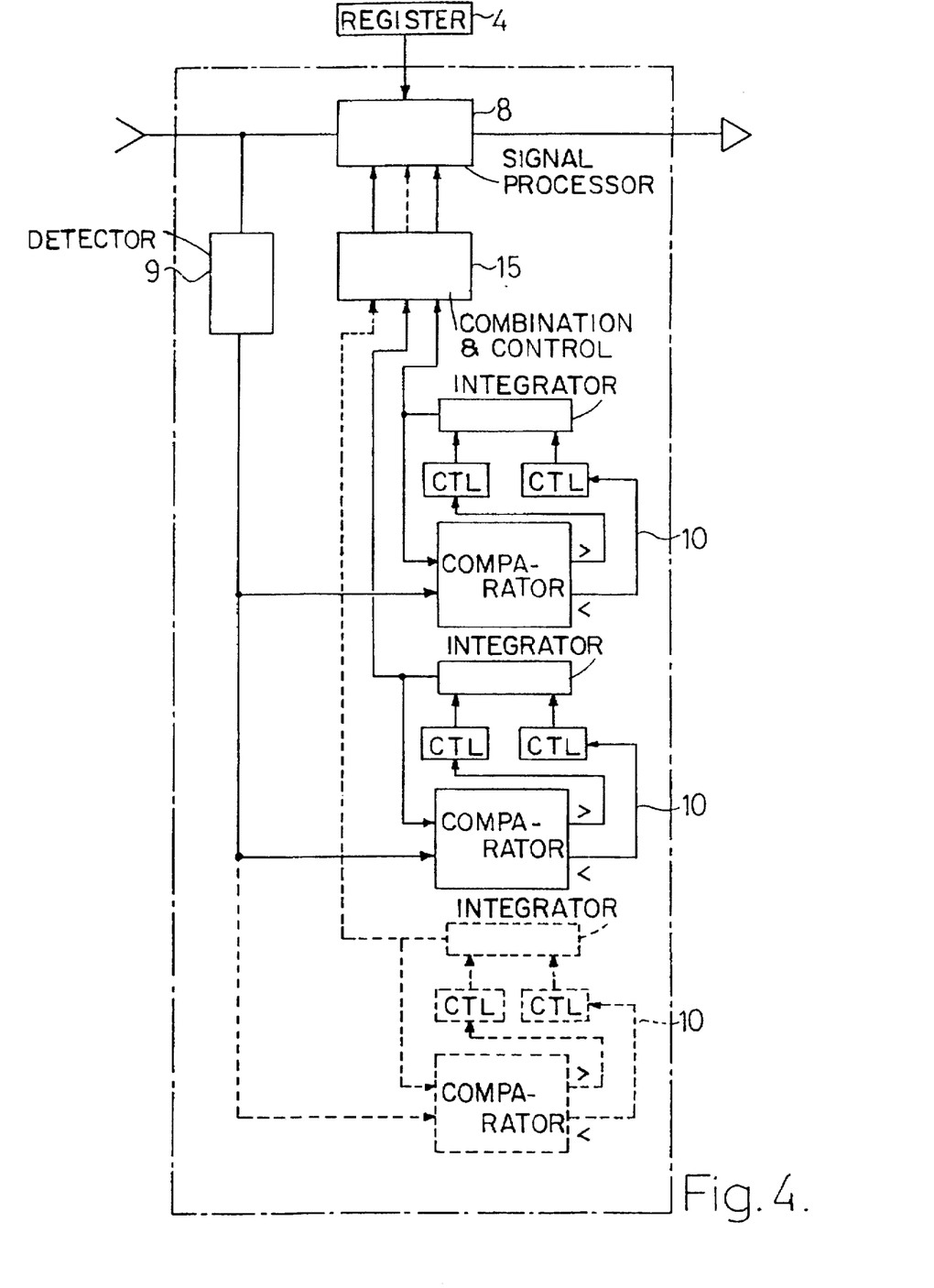
FIG. 4 shows a more detailed schematic representation of the circuit in accordance with FIG. 3.

FIG. 4 shows in schematic form a channel of the hearing aid in accordance with FIG. 3 with a few more details, whereby these do not require any special explanation. Identical parts are clearly recognizable and are identifiable in conjunction with FIGS. 2 and 3. Frequency analysis can take place in the usual way by a number of filters with essentially adjacent pass bands. Alternatively, this frequency analysis can also be performed by means of Fourier transformation.

FIG. 5 again schematically shows a channel of a hearing aid, which may naturally also possess several channels, in which the input signal supplied to the percentile estimator 10 is digitized in an analog/digital converter and where the digital output signal of the integrator 11 is supplied to the analog electronic signal processor 8 via a digital/analog converter.

Figure 5:
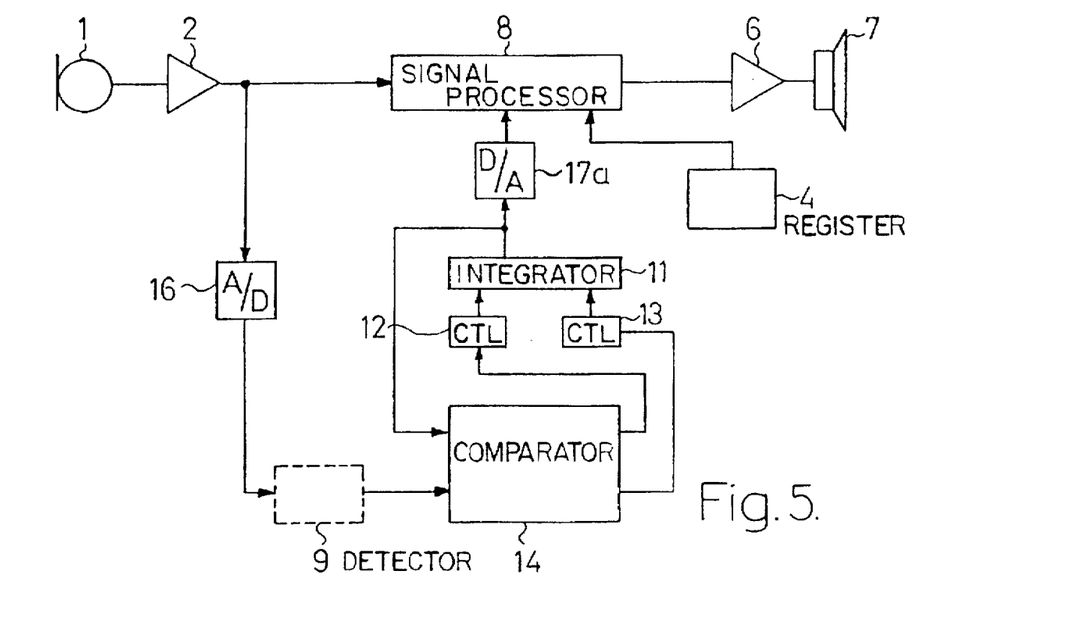
FIG. 5 shows a schematic diagram of the same circuit as in FIG. 2 with digital control circuit.

In this case, the integrator 11 is a reversible binary counter, the control stages 12 and 13 are digital counting control stages, and the comparator circuit 14 also operates digitally, but with its own sampling rate which is controlled via a separate clock generator (not shown). There is no relationship between the clock frequency of the analog/digital converters and the digital/analog converters and the clock frequency of the comparator circuit 14. However, if all stages were to be combined in highly integrated circuits, it is conceivable that the significantly lower clock frequency of the comparator circuit 14 could be derived from a clock generator provided for the converters 16 and 17.

Here too, a detector stage 9 can be provided which in this case outputs a digital signal sequence corresponding to the amplitude values of the input signal. The counting control stages 12 and 13 may be registers, for example, in which counting steps are stored, saved or programmed. The counter value of the reversible counter 11 is incremented by the predefined counting value step if the counter value of the input signal is lower than the count value of said counter when a comparison takes place. Conversely, the count value of the counter 11 is reduced by the counting step value stored in the counting control stage 13 if the count value of the input signal is greater than the value stored in the counter 11 when a comparison takes place. These counting step values are preferably also different. This will be explained in detail below.

Figure 6:
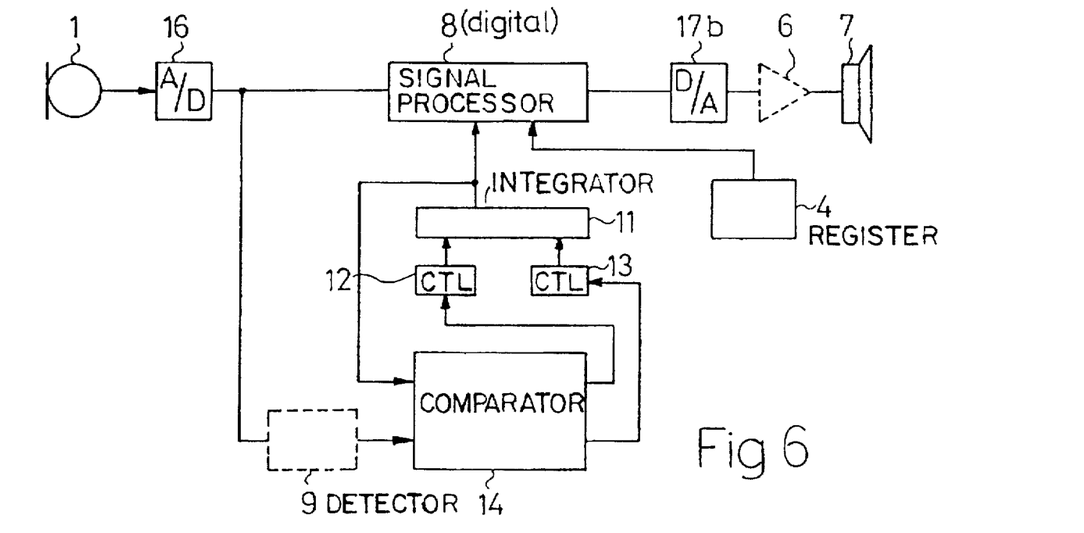
FIG. 6 shows a schematic diagram of the same circuit as in FIG. 5, but in a completely digital embodiment.

FIG. 6 shows the circuit realized completely in digital technology. Identical parts are provided with the same reference numbers and need no special explanation. The signal processor 8 is a fully digital circuit, consisting, for example, of digital controllable filters, digital controllable attenuators and digital amplifier stages, and possibly even of digital compression circuits. It is clear that as many electronic circuits as possible can be combined into highly integrated circuits in this case.

The mode of operation of this very complex circuit will now be explained with reference to FIGS. 7 to 10. Determination of percentile values can take place in various analog or digital ways. The time functions of the percentile values to be determined depend on the choice of the time intervals between the individual comparisons and the respective values by which the value stored in the integrator 11 or reversible counter is incremented or decremented in each case. The following expressions and symbols are used:

Percentile level, e.g. 75 dB SPL (signal sound pressure level), i.e. the level below which p percent of all discrete signal values lie;

u=the number of up-counting steps/second d=the number of down-counting steps/second We thus obtain:

$p = 100 \, u/(u+d)$.

The values of u and d can be multiplied by a constant without the value of p changing. This calculation can also be seen as an operation based on addition. In other words, a certain value is added to a value stored in the integrator 11, for example, if the previous value is lower than the instantaneous value of the signal. In contrast, a different value is subtracted from the value in the integrator 11 if this value is greater than the instantaneous value of the signal.

The operation can also be performed by means of multiplication.

The value contained in the integrator 11 is then multiplied by factor a <1 if the stored value is greater than the instantaneous value of the input signal or its envelope or of a logarithmically transformed signal, or is multiplied by b>1 if the stored value is lower than the instantaneous value of the signal.

In this case, the relationship between p, a and b is given by $p = 100 \log(b)/\log(b) \text{ minus } \log(a)$.

a and b can be raised to a certain power without the value of p changing. However, this will have an influence on the "time constants" of the respective changes.

This will be explained by reference to an example for the additive method. If, for example, the reversible counter 11 is a 15-bit register with possible values from 0 to 32,768 and the percentile estimator 10 is to approximate the 80% percentile, we obtain the formulae $p = 100 \, u/(u+d)$ or $u = d \times p/(100-p)$ or $u = d \times 4$ where p=percentile, u=up-counting steps in the counting control stage 12 and d=down-counting steps in the counting control stage 13.

From here, it is possible to freely choose the values for u and d, but their absolute value will have a direct influence on the response time of the system. The same is also valid for the release time. If we choose d=10,000 and u=40,000, for example, this means that the system will have adjusted itself to the new situation in less than a second in the event of a change in the input signal from silence to an essentially constant sound level. (Response time=32,768/40,000 sec.= 0.8192 sec.)

In contrast, the transition from this sound situation will require more than three seconds (release time=32,768/10,000 sec.=3.2768 sec.) until the system has adjusted itself fully to the old situation again.

If, on the other hand, we choose d=2000 and u=8000, we obtain a response time of 4.096 sec. and a corresponding release time of 16.384 sec.

It can therefore be seen that the desired response and release times are easily adjustable and are thus also programmable for the desired percentile.

Figure 7:
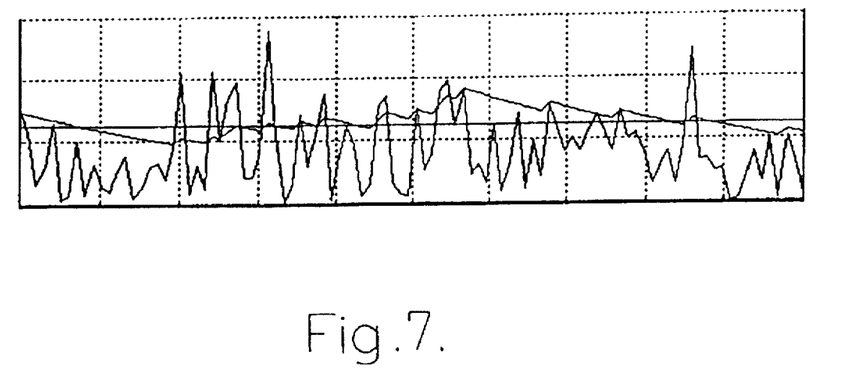
FIG. 7 shows a diagram for explanation of the mode of operation of the control circuit for a percentile value of 80%.

FIG. 7 shows this in detail for a simple example. This diagram shows as an example an envelope function and the time characteristic for calculation of the 80% percentile. The calculated percentile is shown as a horizontal line.

The envelope function of FIG. 7 is determined from the input signal by simple rectification. However, other more or less complex methods are also possible. As already stated above, the level below which 80% of the individual signal values lie is represented by a horizontal line. Calculation is performed by setting the percentile estimator to a first starting value. In this case, the value is the amplitude of the first signal value. The instantaneous value of the next signal value is compared with the just stored value. The stored value is then incremented by a predefined amount if the stored or subsequently determined value is lower than the next signal value. This can be seen clearly.

However, if the next signal value is greater than the previously stored value, the stored value is reduced by a predefined amount. The 80% percentile was calculated by multiplication using the above formula with a=0.9765 and b=1.1.

Figure 8:
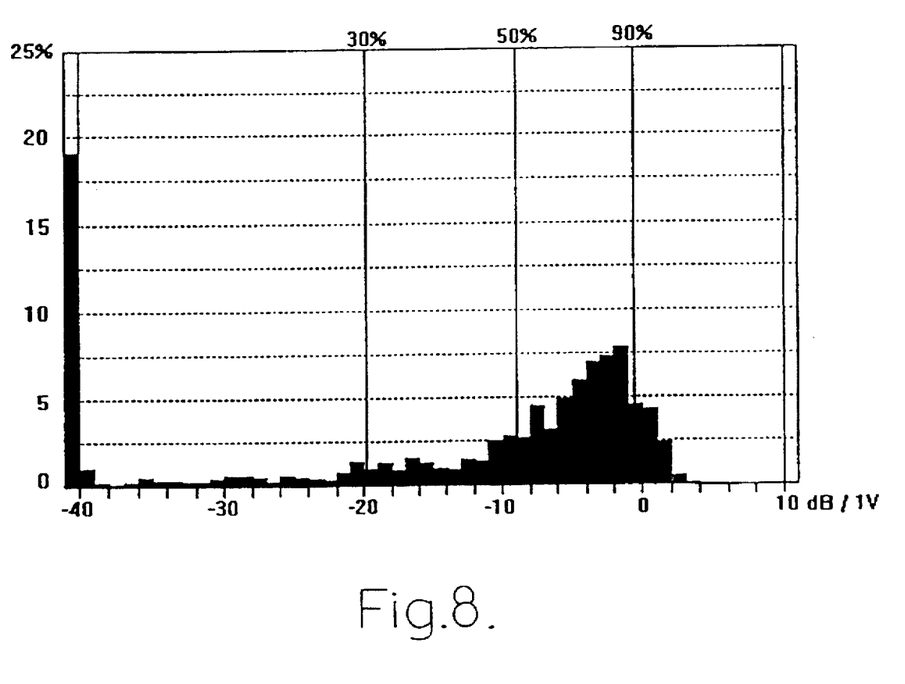
FIG. 8 shows a histogram of the energy distribution of a speech signal.
Figure 9:
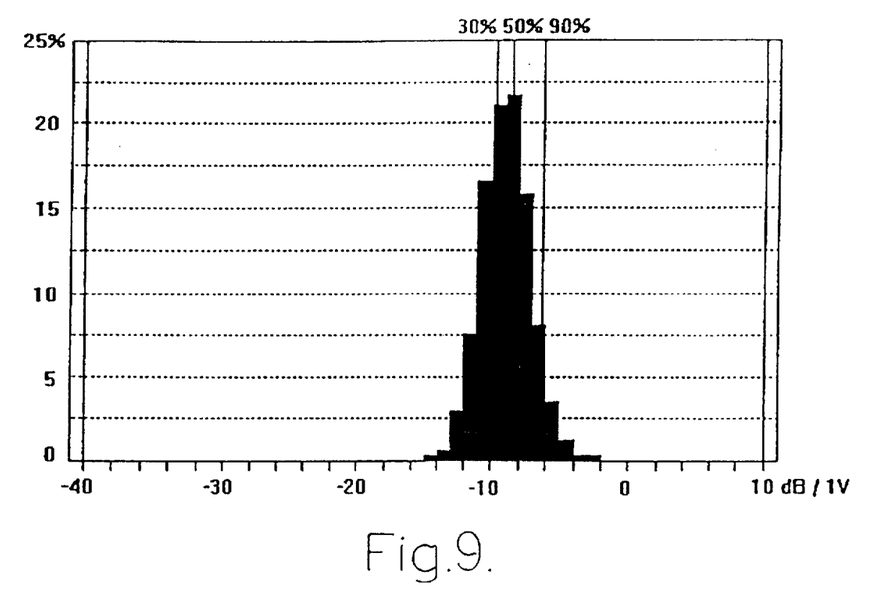
FIG. 9 shows a histogram of the energy distribution of a noise signal.
Figure 10:
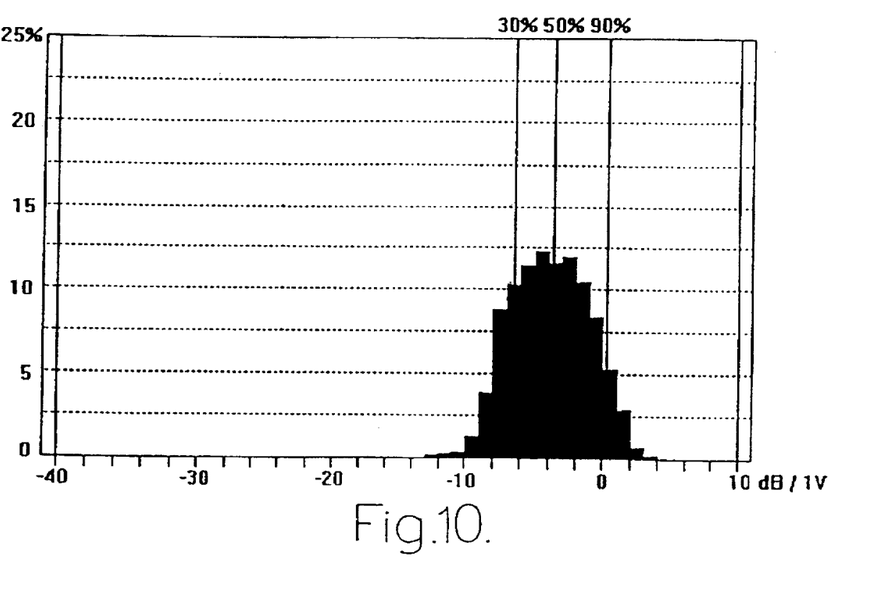
FIG. 10 shows a histogram of the energy distribution of a signal made up of a speech signal and noise signal.

It will now be shown with reference to FIGS. 8, 9 and 10 which effects the various ambient situations have on the energy distribution, whereby the percentiles 30%, 50% and 90% are shown in each case.

The root mean square values of 1,250 successive 20 ms long intervals of a continuous sound event, here, for example, speech, are calculated. The speech signal analyzed here thus has a total duration of 1,250×0.02 sec.=25 sec. The short-time levels of the root mean square values are classified in two classes with a length of 1 dB corresponding to their values. The relative number in each class is represented by a histogram. Thus, it is evident from FIG. 8, for example, that 5% of the intervals possess a root mean square value between −5 and −6 dB relative to 1 Volt (dB/1 V). In particular, it is worth noting that the levels of almost 19% of all intervals lie below −40 dB /1 V.

FIG. 9 shows a histogram of the distribution of the short-time levels of a noise signal (the noise produced at a party). The levels are shown corresponding to the percentiles 30%, 50% and 90%.

The root mean square values of the levels of 1,250 successive 20 ms long intervals of a so-called party noise are calculated. The total duration of the noise signal is 25 sec. It is evident from FIG. 9 that approximately 22% of the intervals possess a root mean square value of between −8 and −9 dB/1 V. There are no signal levels below −15 dB/1 V.

Finally, FIG. 10 shows the short-time distribution of a signal made up of speech and noise in a histogram. The levels again correspond to the percentiles 30%, 50% and 90%.

The speech signal of FIG. 9 is superposed on the speech signal of FIG. 8. The root mean square values of the levels of 1,250 successive 20 ms long intervals of the mixed signal were calculated. It is evident from FIG. 10 that approximately 5% of the intervals possess a root mean square value of between 1 and 0 dB/1 V. No intervals had levels below −13 dB/1 V.

It is thus possible to see that normal continuous speech without great volume fluctuations will be concentrated around a given percentile value. The signal will settle around the given percentile value and will not generate a control signal that changes the gain and/or frequency response of the electronic signal processor. However, if a noise signal in accordance with FIG. 9 is superposed, the amplitude distribution will change drastically and a control operation will be initiated which results in a considerable change in the transmission characteristic depending on the number of channels with their channel signal processors and on the number of open-loop-controllable or closed-loop-controllable stages of the signal processors. In other words, the controlled variables required for control are derived from the input signal with the help of the percentile estimators.

The function of the combination and control logic 15 will now be explained in more detail for the purpose of better understanding.

It is a typical characteristic of continuous sound events such as ambient noise and some types of music that the distribution of the short-time levels of the root mean square values measured on a dB scale is practically symmetrical, i.e. the percentile 50% corresponds approximately to the arithmetic mean value of the percentiles 10% and 90%, as is shown, for example, in FIG. 9.

On the other hand, it is also characteristic for pulse-type sound events such as knocking noises, hammering or speech that the distribution of the short-time levels of the root mean square values is asymmetrical, i.e. the percentile 50% is located well away from the arithmetic mean value of the levels of the 10% and 90% percentiles. This is shown, for example, in FIG. 8.

This is due to the pauses between the pulses or speech segments.

Consequently, the values of the 10%, 50% and 90% percentiles can be used in combination in an actual hearing aid in order to decide whether the sound environment possesses a continuous or pulse-type character. This is of crucial importance, since noise or background noise influence speech comprehension by masking, i.e. covering, the speech. However, the masking effect of pulse-type noise differs fundamentally from the masking effect of continuous noise and thus requires a different method of control.

The function of the combination and control logic 15 can therefore be that of generating a control signal which is either proportional or in another relationship to the metric value of the output signals of the three percentile estimators. This value is calculated in accordance with the formula (level 90%×level 10%−2×level 50%).

This metric value will then be approximately 0 for asymmetrical distribution of the short-time levels of the root mean square values, while it will be either positive or negative depending on how the distribution is displaced to the left or right from the mean value as in the histograms. In other words, the percentile estimators 10 could be chosen for a first percentile value of 10% for the upper percentile estimator, a second percentile value of 90% for the middle percentile estimator and a third percentile value of 50% for the lower percentile estimator. The initial values determined in this way could then be combined in the combination and control logic in accordance with the above-specified relationship and could supply a control signal depending on the type and magnitude of the combined output signal of the three percentile estimators, whereby said control signal would reduce or increase the gain or leave it unchanged. This is valid for one channel or several channels.

Finally, it must be mentioned that both open-loop control of the control stages 12 and 13 and open-loop control of the combination and control logic 15 can be realized via a common central control unit, e.g. a microprocessor, which in turn can also be activated by an external controller.

Many variation possibilities for automatic control of hearing aids dependent on the input signal can be realized, since both the counting step values and the percentile values defined for the percentile estimators can in principle be chosen freely or can also be activated or programmed via a remote control where appropriate.

I claim:

1. A circuit arrangement for a preferably programmable hearing aid with at least one microphone, at least one electronic signal processing circuit (3) and one output transducer (7), in which the electronic signal processing circuit (3) has a transfer characteristic controllable in response to control signals and contains a control circuit for continuous determination of at least one percentile value of the input signal from a continuous analysis and evaluation of the input signal, whereby said percentile values serve either directly or indirectly as said control signals.

2. A circuit arrangement in accordance with claim 1, wherein said control circuit includes at least one percentile estimator (10) connected to receive said input signal, said percentile estimator comprising an integrator (11) which increases its integration value in response to a first control input and decreases its integration value in response to a second control input, a first control stage (12) providing said first control input, a second control stage (13) providing said second control input and a comparator stage (14) with at least two inputs, whereby said input signal is connected directly or indirectly with one input of the comparator stage (14), a second input of the comparator stage being connected with the output of the integrator (11) and directly or indirectly with the signal processing circuit (3), said comparator controlling said first and second control stages.

3. A circuit arrangement for a hearing aid in accordance with claim 2, further comprising a detector stage (9) connected between the input of the circuit and the input of the percentile estimator (10) for mathematic processing of the input signal by way of predefined or predefinable algorithms or calculating rules.

4. A circuit arrangement for a hearing aid in accordance with claim 3, wherein said detector stage (9) comprises a rectifier for detecting the envelope of the input signal.

5. A circuit arrangement for a hearing aid in accordance with claim 1, in which said control circuit determines at least two percentile values, and wherein a predefined or programmable combination of these percentile values serves to control the transfer characteristic of the respective channel.

6. A circuit arrangement for a hearing aid in accordance with claim 5, in which the percentile values and/or control algorithms can be adjusted or exchanged by the wearer of the hearing aid.

7. A circuit arrangement for a hearing aid in accordance with claim 6, in which the adjustment or exchange of percentiles and/or control algorithms can be performed by means of a remote control device.

8. A circuit arrangement for a hearing aid in accordance with claim 2, further comprising an analog/digital converter (16) connecting said input signal to said at least one percentile estimator, and wherein said integrator comprises a reversible binary counter, said first control stage comprises an up-counting control stage (12) connected to said counter, said second control stage comprises a down-counting control stage (13) also connected to said counter and said comparator stage comprises a digital comparator stage (14), an output of the integrator being connected to the signal processing circuit (3) via a digital/analog converter (17).

9. A circuit arrangement for a hearing aid in accordance with claim 8, in which the number of positive or negative counting steps to be initiated in the reversible counter (11) after every comparison is fixed in the two control stages (12, 13).

10. A circuit arrangement for a hearing aid in accordance with claim 9, in which the number of the counting steps in the two control stages (12, 13) is the same.

11. A circuit arrangement for a hearing aid in accordance with claim 9, in which the number of the counting steps in the two control stages (12, 13) is significantly larger in one of the two control stages than in the other.

12. A circuit arrangement for a hearing aid in accordance with claim 8, further comprising a detection stage (9) connected between the analog/digital converter (15) and the input of the percentile estimator for determination of a signal sequence by means of a mathematical operation or for determination of the envelope.

13. A circuit arrangement for a hearing aid in accordance with claim 8, in which the number of positive or negative counting steps to be initiated in the reversible counter (11) after every comparison is adjustable or programmable in the two control stages (12, 13).

14. A circuit arrangement in accordance with claim 2, comprising a plurality of electronic signal processing circuits each covering a different frequency band, and a plurality of percentile estimators, at least one percentile estimator in each band, each percentile estimator generating a control signal for a respective one of said electronic signal processing circuits.

15. A circuit arrangement for a hearing aid in accordance with claim 14, wherein each signal processing circuit includes at least two percentile estimators connected in parallel and each channel further includes a combination and control circuit receiving the outputs of the integrators (11) of the percentile estimators of its respective channel, each said combination and control logic providing said control signals to the signal processing circuit (3) of the respective channel.

16. A circuit arrangement for a hearing aid in accordance with claim 14, in which said control circuit determines at least two percentile values, and wherein a predefined or programmable combination of these percentile values serves to control the transfer characteristic of the respective channel.

17. A circuit arrangement for a hearing aid in accordance with claim 16, in which the percentile values and/or control algorithms can be adjusted or exchanged by the wearer of the hearing aid.

18. A circuit arrangement for a hearing aid in accordance with claim 17, in which the adjustment or exchange of percentiles and/or control algorithms can be performed by means of a remote control device.

19. A circuit arrangement in accordance with claim 2, further comprising an analog/digital converter providing said input signal from said microphone to said percentile estimator and a digital/analog converter providing said control signals in accordance with the output of said integrator.

20. A circuit arrangement for a hearing aid in accordance with claim 1, in which said microphone provides an analog output and said electronic signal processing circuit and control circuit are digital, said circuit arrangement further comprising an analog/digital converter (16) coupling the output of said microphone to said electronic signal processing circuit (3) and to said control circuit, the output of the electronic signal processing circuit being connected with the output transducer (7) via a digital/analog converter (17).

21. A circuit arrangement in accordance with claim 20, wherein said control circuit includes at least one percentile estimator (10) connected to receive said input signal, said percentile estimator comprising an integrator (11) which increases its integration value in response to a first control input and decreases its integration value in response to a second control input, a first control stage (12) providing said first control input, a second control stage (13) providing said second control input and a comparator stage (14) with at least two inputs, whereby said input signal is connected directly or indirectly with one input of the comparator stage (14), a second input of the comparator stage being connected with the output of the integrator (11) and directly or indirectly with the signal processing circuit (3), said comparator controlling said first and second control stages.

22. A circuit arrangement for a hearing aid in accordance with claim 21, further comprising a detector stage (9) connected between the input of the circuit and the input of the percentile estimator (10) for mathematic processing of the input signal by way of predefined or predefinable algorithms or calculating rules.

23. A circuit arrangement for a hearing aid in accordance with claim 22, wherein said detector stage (9) comprises a rectifier for detecting the envelope of the input signal.

24. A circuit arrangement for a hearing aid in accordance with claim 23, wherein each signal processing circuit includes at least two percentile estimators connected in parallel and each channel further includes a combination and control circuit receiving the outputs of the integrators (11) of the percentile estimators of its respective channel, each said combination and control logic providing said control signals to the signal processing circuit (3) of the respective channel.

25. A circuit arrangement in accordance with claim 21, comprising a plurality of electronic signal processing circuits each covering a different frequency band, and a plurality of percentile estimators, at least one percentile estimator in each band, each percentile estimator generating a control signal for a respective one of said electronic signal processing circuits.

26. A circuit arrangement for a hearing aid in accordance with claim 20, wherein said integrator comprises a reversible binary counter, said first control stage comprises an up-counting control stage (12) connected to said counter, said second control stage comprises a down-counting control stage (13) also connected to said counter and said comparator stage comprises a digital comparator stage (14), an output of the integrator being connected to the signal processing circuit (3).

27. A circuit arrangement for a hearing aid in accordance with claim 26, in which the number of positive or negative counting steps to be initiated in the reversible counter (11) after every comparison is fixed in the two control stages (12, 13).

28. A circuit arrangement for a hearing aid in accordance with claim 27, in which the number of the counting steps in the two control stages (12, 13) is the same.

29. A circuit arrangement for a hearing aid in accordance with claim 27, in which the number of the counting steps in the two control stages (12, 13) is significantly larger in one of the two control stages than in the other.

30. A circuit arrangement for a hearing aid in accordance with claim 26, further comprising a detection stage (9) connected between the analog/digital converter (15) and the input of the percentile estimator for determination of a signal sequence by means of a mathematical operation or for determination of the envelope.

31. A circuit arrangement for a hearing aid in accordance with claim 26, in which the number of positive or negative counting steps to be initiated in the reversible counter (11) after every comparison is adjustable or programmable in the two control stages (12, 13).

32. A circuit arrangement in accordance with claim 1 for a hearing aid, further comprising a register (4) for storing program data/information or control parameters from a remote control device, said program data/information or control parameters being intended for basic adjustment of the hearing aid and/or for adjustment of the transmission characteristic of the hearing aid corresponding to a hearing impairment of the wearer and different environmental situations.

33. A hearing aid having a microphone for providing an input signal representing sound, a processor for said input signal in accordance with a transfer characteristic determined at least in part by a processor control signal, and an output transducer producing sound in accordance with the processed signal, said hearing aid further comprising a control circuit receiving said input signal and comparing said input signal to a reference signal derived from a recent history of said input signal, said control circuit including means for controlling said reference level such that a desired percentage of input signals are above said reference level, said reference level being supplied to said processor as said processor control signal.

34. A hearing aid in accordance with claim 33, wherein said desired percentage is other than 50%.

* * * * *

UNITED STATES PATENT AND TRADEMARK OFFICE
CERTIFICATE OF CORRECTION

PATENT NO. : 5,687,241
DATED : November 11, 1997
INVENTOR(S) : Carl Ludvigsen

It is certified that error appears in the above-identified patent and that said Letters Patent is hereby corrected as shown below:

Column 2,  line 35, delete "farther" and insert --further--.
    Column 7,  line 53, delete "mm" and insert --turn--.
               line 32, delete "asymmetrical" and insert --a symmetrical--.

Signed and Sealed this

Fifteenth Day of September, 1998

Attest:

BRUCE LEHMAN

*Attesting Officer*      *Commissioner of Patents and Trademarks*